(12) United States Patent
Fries et al.

(10) Patent No.: US 6,375,083 B2
(45) Date of Patent: *Apr. 23, 2002

(54) SMART CARD

(75) Inventors: Manfred Fries, Hunderdorf; Frank Püschner, Kelheim; Josef Mundigl, Duggendorf; Jürgen Fischer, Deuerling; Detlef Houdeau, Langquaid, all of (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,131

(22) Filed: Jul. 15, 1999

Related U.S. Application Data

(63) Continuation of application No. PCT/DE98/00033, filed on Jan. 7, 1998.

(30) Foreign Application Priority Data

Jan. 15, 1997 (DE) .......................................... 197 01 167

(51) Int. Cl.[7] .............................................. G06K 19/06
(52) U.S. Cl. ...................................... 235/492; 235/380
(58) Field of Search .................................. 235/380, 492

(56) References Cited

U.S. PATENT DOCUMENTS

| 4,857,893 | A | * | 8/1989 | Carroll | ........................ 340/572 |
| 5,255,430 | A | * | 10/1993 | Tallaksen | ...................... 29/827 |
| 5,308,967 | A | * | 5/1994 | Jurisch | ........................ 235/492 |
| 5,321,240 | A | * | 6/1994 | Takahira | ...................... 235/380 |
| 5,337,063 | A | * | 8/1994 | Takahira | ...................... 343/741 |
| 5,408,243 | A | | 4/1995 | D'Hont | |
| 5,773,812 | A | * | 6/1998 | Kreft | .......................... 235/492 |
| 6,008,993 | A | * | 12/1999 | Kreft | .......................... 361/737 |

FOREIGN PATENT DOCUMENTS

| DE | 3721822 C1 | 11/1988 |
| DE | 4311493 A1 | 10/1994 |
| DE | 4410732 A1 | 10/1995 |
| DE | 4428732 C1 | 1/1996 |
| DE | 4220194 C2 | 2/1996 |

(List continued on next page.)

OTHER PUBLICATIONS

Published International Application No. 96/07985 (Brady et al.), dated Mar. 14, 1996.
Japanese Patent Abstract No. 08202844 (Tsuneichi), dated Aug. 9, 1996.
K. P. Stuby: "Flexible Semiconductor Credit Card", IBM Technical Disclosure Bulletin, vol. 22, No. 6, Nov. 1979.

*Primary Examiner*—Mark Tremblay
(74) *Attorney, Agent, or Firm*—Herbert L. Lerner; Laurence A. Greenberg; Werner H. Stemer

(57) ABSTRACT

A smart card with a card carrier on which a data processing circuit and also a connection assembly for the contactless communication of data between the data processing circuit and an external data processing station are provided. In the course of producing a prior art smart card, an integrated circuit is applied to a card carrier made of plastic. Afterwards, a transmitting/receiving coil connected to corresponding terminals of the integrated circuit is applied along the outer edges of the prior art smart card. In the case of the prior art smart card, the fact that defective prior art smart cards have to be destroyed is disadvantageous. According to the invention, the data processing circuit and the connection assembly are provided in a region of at least one module carrier and the card carrier has a region for accommodating the module carrier. This makes it possible firstly to test the completed module carrier in respect of its proper functioning before it is incorporated into a card carrier.

8 Claims, 2 Drawing Sheets

FOREIGN PATENT DOCUMENTS

| | | |
|---|---|---|
| DE | 4431605 A1 | 3/1996 |
| DE | 4437721 A1 | 4/1996 |
| DE | 19527359 A1 | 2/1997 |
| EP | 0376062 A1 | 7/1990 |
| EP | 0 503 730 B1 | 1/1999 |
| JP | 55-014709 | 2/1980 |
| JP | 05 201 186 A | 8/1993 |
| JP | 07 146 922 | 6/1995 |
| JP | 08 216 570 | 8/1996 |

\* cited by examiner

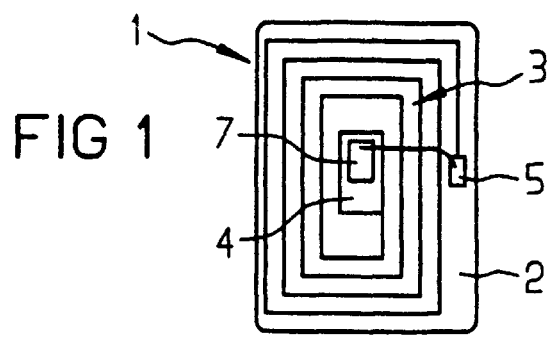
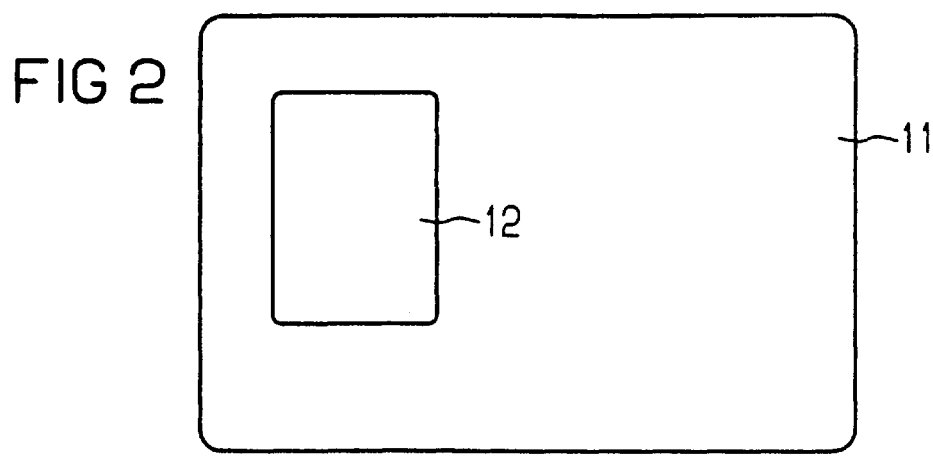
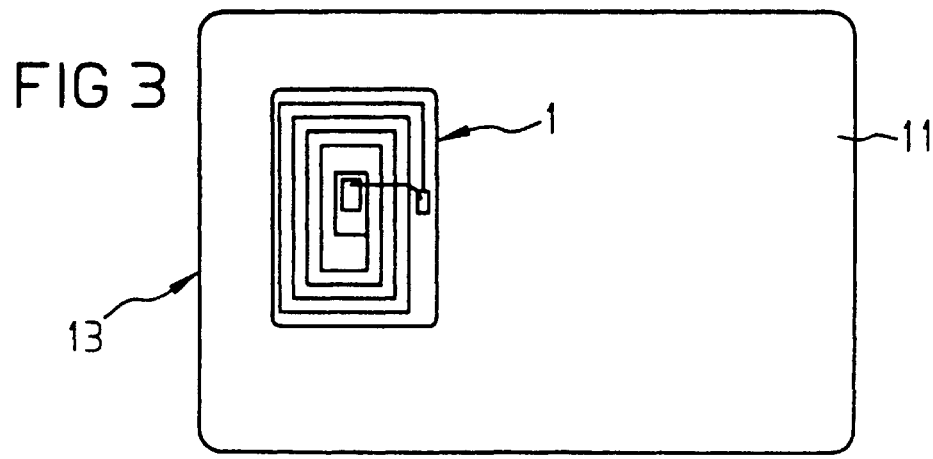

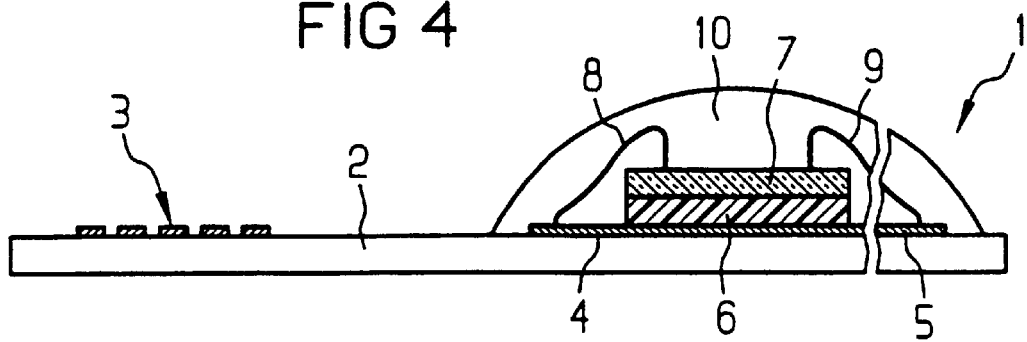
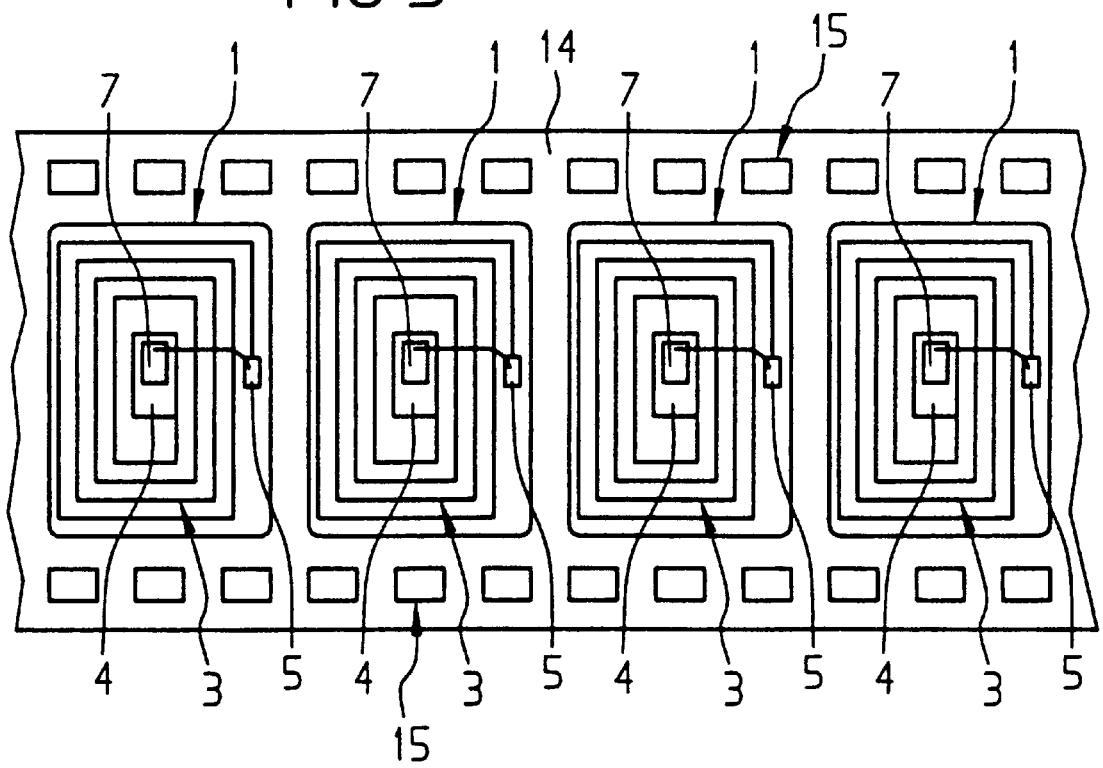

My Company# SMART CARD

CROSS REFERENCE TO RELATED APPLICATION

This is a continuation of copending International Application PCT/DE98/00033, filed Jan. 7, 1998, which designated the United States.

BACKGROUND OF THE INVENTION

FIELD OF THE INVENTION

The invention relates to a smart card with a card carrier on which a data processing circuit and also a connection assembly for the contactless communication of data between the data processing circuit and an external data processing station are provided.

A generic smart card and an external data processing station form a data system that is used for counting cashless purchases, for monitoring passenger traffic or for simple charge management in the context of access to a telephone network. For such purposes, a user acquires a smart card on which a data processing circuit containing a microprocessor is provided. For the communication of data between the data processing circuit and the external data processing station, an alternating field generated by the external data processing station is modulated by the smart card in the case of contactless transmission methods. In this case, by way of example, a smart card coil provided in the connection assembly is subjected to a capacitive or resistive load in a varying manner over time, with the result that its electromagnetic properties alter. This has a reaction upon a station coil in the external data processing station. From the reaction, it is possible to draw conclusions about data stored in the data processing circuit.

The generic smart card is constructed as a plastic card large enough to be stowed securely in a purse, for example. In the course of producing the generic smart card, first of all an integrated circuit is applied to a card carrier made of plastic. Afterwards, a transmitting/receiving coil connected to corresponding terminals of the integrated circuit is applied along the outer edges of the smart card. Such a smart card is disclosed for example in Published, Non-Prosecuted German Patent Application DE 44 10 732 A1. In the case of the generic smart card, the fact that production is complicated and expensive is disadvantageous. If a smart card does not operate correctly, the defective smart card is destroyed.

Published, Non-Prosecuted German Patent Application DE 44 37 721 A1 shows an electronic module for incorporation into a data carrier, the electronic module has an integrated circuit which is disposed on a module carrier and is conductively connected to a coil for contactless data exchange.

SUMMARY OF THE INVENTION

It is accordingly an object of the invention to provide a smart card which overcome the above-mentioned disadvantages of the prior art methods and devices of this general type, which always operates reliably, and is produced reliably and with little outlay.

With the foregoing and other objects in view there is provided, in accordance with the invention, a smart card, containing a card carrier having a given region and at least one module carrier disposed in the given region of the card carrier. The at least one module carrier, includes a base plate; a connection assembly disposed on the base plate and having at least one transmitting/receiving coil with sections disposed in at least two different planes with respect to a main direction in which the base plate extends, the sections of the at least one transmitting/receiving coil operating in a synchronized manner with one another; and a data processing circuit. The connection assembly provides contactless communication of data between the data processing circuit and an external data processing station. In an alternative, the sections are configured such that the sections are kept in a resonance phase angle with respect to one another.

According to the invention, the data processing circuit and the connection assembly are provided in the region of at least one module carrier and the card carrier has a region for accommodating the module carrier or the module carriers.

The invention is based on the fundamental concept that the disadvantages in generic smart cards stem from the fact that only when the smart card has been completed is it possible to test whether the integrated circuit cooperates correctly with the transmitting/receiving coil. According to the invention, the parts which are essential for the functioning of the smart card, that is to say a functional assembly, are produced separately from the card carrier on the module carrier and connected to one another only during the final assembly of the card carrier and the module carrier. This makes it possible firstly to test the functional assembly in respect to its functioning. If it is established that the data processing circuit does not cooperate correctly with the connection assembly on the functional assembly, then the functional assembly can be destroyed without an inherently useful card carrier having to be destroyed as well. Furthermore, it is possible to accelerate the production of the functional assembly since the module carrier, which takes up only a small amount of space, makes it possible to provide smaller and faster production apparatuses.

According to the invention, the module carrier can be fixedly connected to the smart card, it being possible for that region which is provided on the card carrier for accommodating the module carrier also to be configured as a cutout. With a suitable configuration of the module carrier and the cutout, it is possible to ensure that a positively locking connection is already produced when the module carrier is inserted into the receptacle, the connection only having to be fixed.

A particularly advantageous smart card according to the invention is produced when the connection assembly has at least one transmitting/receiving coil which can also be disposed in two different planes with respect to the main direction in which the module carrier extends. In this case, provision is made, in particular, for a section of the transmitting/receiving coil to be disposed on a surface of the module carrier, while another section may be disposed in a layer inside of the module carrier. This can be achieved in a particularly simple manner by use of a two-layer metallization coating, a sandwich-like structure being particularly appropriate for the module carrier. In this case, the sections of the transmitting/receiving coil on the surface of the module carrier and inside the module carrier may be disposed in a plane-parallel manner, the individual sections being connected to one another by contacts. This can be achieved in a particularly simple manner by use of plated-through holes in the region of terminals of the respective transmitting/receiving coil regions. It is preferable for the individual sections of the transmitting/receiving coil to be connected in series, since this results in a transmitting/receiving coil which can influence an external alternating field with a high efficiency. In this case, a particularly high efficiency of the transmitting/receiving coil is produced when the transmission device, which is often part of the data processing circuit, is configured in such a way that the sections of the transmitting/receiving coil can be kept in a resonance phase angle with respect to one another. This can be done for example by suitably connecting in capacitances and/or inductances, this preferably being done in such a way that the resonant frequencies of the regions of the transmitting/receiving coil in each case correspond.

In a departure from this, or to supplement the above-mentioned embodiment, the transmission device may also be configured in such a way that the sections of the transmitting/receiving coil can be operated such that they are synchronized with one another. This can advantageously be done so as to result in amplification of the alternating field issuing from the transmitting/receiving coil. This is significant for active cards that emit a signal. By applying phase gating technology, it is possible to achieve synchronization of the signals in with the sections of the transmitting/receiving coil, to be precise in such a way as to result in amplification of an alternating field generated by the transmitting/receiving coil. In the case of passive cards, it is thereby possible to achieve a particularly high degree of coupling between the smart card and an external data processing station.

A further improvement in the transmission quality of data between the smart card and the external data processing station is produced when the module carrier has at least one section configured as a coil core for the transmitting/receiving coil. In this case, the module carrier may be formed from plastic into which permeable material such as ferrite, for example, is incorporated. If the permeable material is present as a multiplicity of ferrite particles, the latter are bound, for the purpose of mutual insulation, in a synthetic composition provided in the module carrier. The coil core produced in this way serves for achieving a high field amplification factor. Such a dielectric makes it possible to achieve relative magnetic permeabilities of the order of magnitude of 5,000 and thus high flux densities.

A method for producing the module carrier for the smart card configured in the manner described above has the following steps:

a. incorporating a first coil section into a plastic layer;
   b. applying a second coil section to the plastic layer;
   c. connecting terminal regions of the first coil section and of the second coil section to one another; and
   d. applying an integrated circuit to the module carrier.

In this case, the step of connecting the terminal regions of the first coil section to the second coil section can be effected by through-plating, which can be achieved in a simple manner using known production methods.

The step of applying the integrated circuit can be effected either by a flip-chip technique or by conventional bonding techniques. In the case of the conventional bonding techniques, it is possible to have recourse to a conductive adhesive or to known solders as the bonding agent. Especially in the case of the bonding techniques, it is provided that not only the connection assembly but also the data processing circuit may optionally be covered with a hard-enable covering composition, to be precise, in particular after the production of the module carrier. The covering compositions used for this purpose may be in particular thermally or UV curing.

The invention also relates to a method for producing a smart card which has the following steps:

a. providing a card carrier having a receptacle for a module carrier;
   b. providing a module carrier according to the invention having a data processing circuit and a connection assembly;
   c. introducing the module carrier into the receptacle; and
   d. connecting the module carrier to the card carrier.

The method according to the invention enables a smart card to be produced in a particularly simple and cost-effective manner.

The above-mentioned production steps for producing the smart card according to the invention and/or the module carrier according to the invention with a double-layered transmitting/receiving coil can, of course, also be applied to the production of smart cards and/or module carriers with a single coil layer.

Other features which are considered as characteristic for the invention are set forth in the appended claims.

Although the invention is illustrated and described herein as embodied in a smart card, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a module carrier with a data processing circuit and with a transmitting/receiving coil according to the invention;

FIG. 2 is a plan view of a card carrier;

FIG. 3 is a plan view of a smart card with the module carrier shown in FIG. 1 and the card carrier shown in FIG. 2;

FIG. 4 is a sectional view of the module carrier shown in FIG. 1; and

FIG. 5 is a plan view of a continuous strip for the production of the module carrier shown in FIG. 1.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a module carrier 1 of a smart card 13 according to the invention. The module carrier 1 has a base plate 2 produced from plastic and an essentially rectangular cross section. In this case, corners of the base plate 2 are rounded, as can be seen particularly clearly in FIG. 1. A transmitting/receiving coil 3 is provided on a top side of the base plate 2 by use of metallization, in which case turns of the transmitting/receiving coil 3, proceeding from a first terminal contact 4 provided in a center of the base plate 2, extend essentially spirally around the first terminal contact 4 as far as a second terminal contact 5.

As is best seen in FIG. 4, an integrated circuit 7 is fitted on the first terminal contact 4 by an insulating adhesive layer 6. The integrated circuit 7 has a first connecting line 8 connected to the first terminal contact 4, and also a second connecting line 9 connected to the second terminal contact 5. In the view shown in FIG. 4, a region between the integrated circuit 7 and the second terminal contact 5 is illustrated as having been broken out from the module carrier 1 in order to allow the module carrier 1 to be illustrated more simply in the drawing.

As is likewise readily evident in FIG. 4, the module carrier 1 is covered with a covering layer 10 made of a thermally curable or UV-curable composition in a region of the first terminal contact 4 and in a region of the second terminal contact 5.

FIG. 2 shows a card carrier 11 with an essentially rectangular outer shape having a rectangular recess 12 for accommodating the module carrier 1 shown in FIG. 1. The card carrier 11 is produced from a plastic plate having essentially the same thickness as the base plate 2 of the module carrier 1. The recess 12 is in this case formed in such a way that the module carrier 1 can be inserted into the recess 12 in a positive locking manner.

FIG. 3 shows the smart card 13 according to the invention, which is composed of the module carrier 1 in accordance with FIGS. 1 and 4 and of the card carrier 11 in accordance with FIG. 2. As can be seen particularly well in this view, the module carrier 1 is inserted into the recess 12 in such a way as to produce a positively locking connection. In this state, the module carrier 1 is additionally connected to the card carrier 11 by an adhesive bond.

Both the base plate 2 and the card carrier 11 can be produced from a plastic such as glass fiber reinforced epoxy resin, PVC, PET, PC and/or ABS. The transmitting/receiving coil 3 can be applied to the base plate 2 using an etching, winding, laying or printing technique.

As can be seen particularly well in FIG. 5, the module carriers 1 according to the invention are fabricated in a continuous strip process, provision being made of a continuous strip 14 made of a plastic which has a respective conveying perforation 15 on both long sides. The provision of the conveying perforation 15 results in that the continuous strip 14 can be guided in a particularly simple manner through machines used in the production of the module carriers 1 according to the invention.

Following the completion of the continuous strip 14 with the module carriers 1 provided thereon, these are individually tested and subsequently detached from the continuous strip 14 by performing a stamping process. In a further method step (not illustrated here), the module carriers 1 that have been tested in respect of their functioning are inserted into card carriers 11 that are ready, and the smart cards 13 according to the invention are thereby completed.

With the module carrier 1 according to the invention, the transmitting/receiving coil 3 is combined with the semiconductor chip 7 in a single module carrier 1 that can be mass-produced in a simple manner. The module carriers 1 according to the invention are inserted into the card carrier 11 only in a concluding work step. In this case, the semiconductor chip 7 can be fixed on the module carrier 2 according to the invention either according to a conventional wire bonding technique or by a flip-chip technique.

We claim:

1. A module carrier for use in a smart card, comprising:

a plastic base plate having a first portion and a second portion;

a transmission device secured to said first portion of said base plate;

at least one transmitting/receiving coil secured to said second portion of said base plate, said at least one transmitting/receiving coil having sections disposed in at least two different planes and disposed one above one another with respect to a main direction in which said base plate extends;

said transmission device configured such that said sections are kept in a resonance phase angle with respect to one another so that resonance frequencies of said sections correspond.

2. The module carrier according to claim 1, wherein said sections of said coil include two sections connected in series.

3. A module carrier for use in a smart card, comprising:

a plastic base plate having a first portion and a second portion;

a transmission device secured to said first portion of said base plate;

at least one transmitting/receiving coil secured to said second portion of said base plate, said at least one transmitting/receiving coil having sections disposed in at least two different planes and disposed one above one another with respect to a main direction in which said base plate extends;

said transmission device configured such that said sections are kept in a resonance phase angle with respect to one another so that resonance frequencies of said sections correspond;

said sections including at least one section configured as a coil core.

4. The module carrier according to claim 1, wherein said plastic base plate is formed from a material selected from the group consisting of glass fiber reinforced epoxy resin, PVC, PET, PC, and ABS.

5. The module carrier according to claim 1, wherein said sections of said coil operate in a synchronized manner with one another.

6. The module carrier according to claim 1, wherein said sections of said coil include a section secured in said base plate.

7. The module carrier according to claim 1, wherein said sections of said coil include a section secured on said base plate.

8. The module carrier according to claim 1, wherein said sections of said coil include a section secured in said base plate and another section secured on said base plate.

* * * * *